(12) United States Patent
Ueda et al.

(10) Patent No.: US 9,793,136 B2
(45) Date of Patent: Oct. 17, 2017

(54) PLASMA ETCHING METHOD

(71) Applicant: Tokyo Electron Limited, Tokyo (JP)

(72) Inventors: Kosei Ueda, Hwaseong-si (KR);
Yoshinobu Hayakawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/959,029

(22) Filed: Dec. 4, 2015

(65) Prior Publication Data
US 2016/0172205 A1    Jun. 16, 2016

(30) Foreign Application Priority Data
Dec. 11, 2014 (JP) ................. 2014-251071

(51) Int. Cl.
| | | |
|---|---|---|
| H01B 13/00 | (2006.01) | |
| C03C 15/00 | (2006.01) | |
| C03C 25/68 | (2006.01) | |
| C23F 1/00 | (2006.01) | |
| B44C 1/22 | (2006.01) | |
| H01L 21/302 | (2006.01) | |
| H01L 21/461 | (2006.01) | |
| H01L 21/311 | (2006.01) | |
| H01L 21/768 | (2006.01) | |
| H01L 21/3065 | (2006.01) | |
| H01L 21/67 | (2006.01) | |
| H01J 37/32 | (2006.01) | |

(52) U.S. Cl.
CPC .. *H01L 21/31144* (2013.01); *H01J 37/32082* (2013.01); *H01J 37/32192* (2013.01); *H01L 21/3065* (2013.01); *H01L 21/31116* (2013.01); *H01L 21/67248* (2013.01); *H01L 21/76804* (2013.01)

(58) Field of Classification Search
None
See application file for complete search history.

(56) References Cited

U.S. PATENT DOCUMENTS

| | | | | |
|---|---|---|---|---|
| 5,605,600 | A * | 2/1997 | Muller | ............... H01L 21/3065 216/37 |
| 2008/0061029 | A1* | 3/2008 | Lai | ..................... B81C 1/00626 216/37 |
| 2011/0045672 | A1* | 2/2011 | Srinivasan | ............... C23F 4/00 438/696 |

FOREIGN PATENT DOCUMENTS

JP        3681533 B        5/2005

\* cited by examiner

*Primary Examiner* — Stephanie Duclair
(74) *Attorney, Agent, or Firm* — Pearne & Gordon LLP

(57) ABSTRACT

A plasma etching method can form a hole having a required opening diameter in a silicon nitride layer, while suppressing a tip end portion of the hole from being narrowed. The plasma etching method includes a first process of supplying a processing gas containing oxygen and fluorocarbon into a plasma processing apparatus; and a second process of etching a silicon nitride layer 106a of a processing target object with a first mask 106 by exciting the processing gas into plasma. Further, the second process is performed in a state where an organic film ad generated from the processing gas is formed on an inner wall of an opening of the first mask 106 by gradually reducing a temperature of the processing target object from a first temperature T1 (80° C.) to a second temperature T2 (40° C.).

3 Claims, 5 Drawing Sheets

FIG. 3

| model | Fixed Temp 80°C | DDPC 80°C → 40°C | Fixed Temp 40°C |
|---|---|---|---|
| Profile | Ion, 106, 106a, 102 (Taper) | 106, 106a, 102 (Vertical) | 106, 106a, 102 (Vertical) |
| CD | Shrink | Shrink | Large |
| Profile | Taper | Vertical | Vertical |

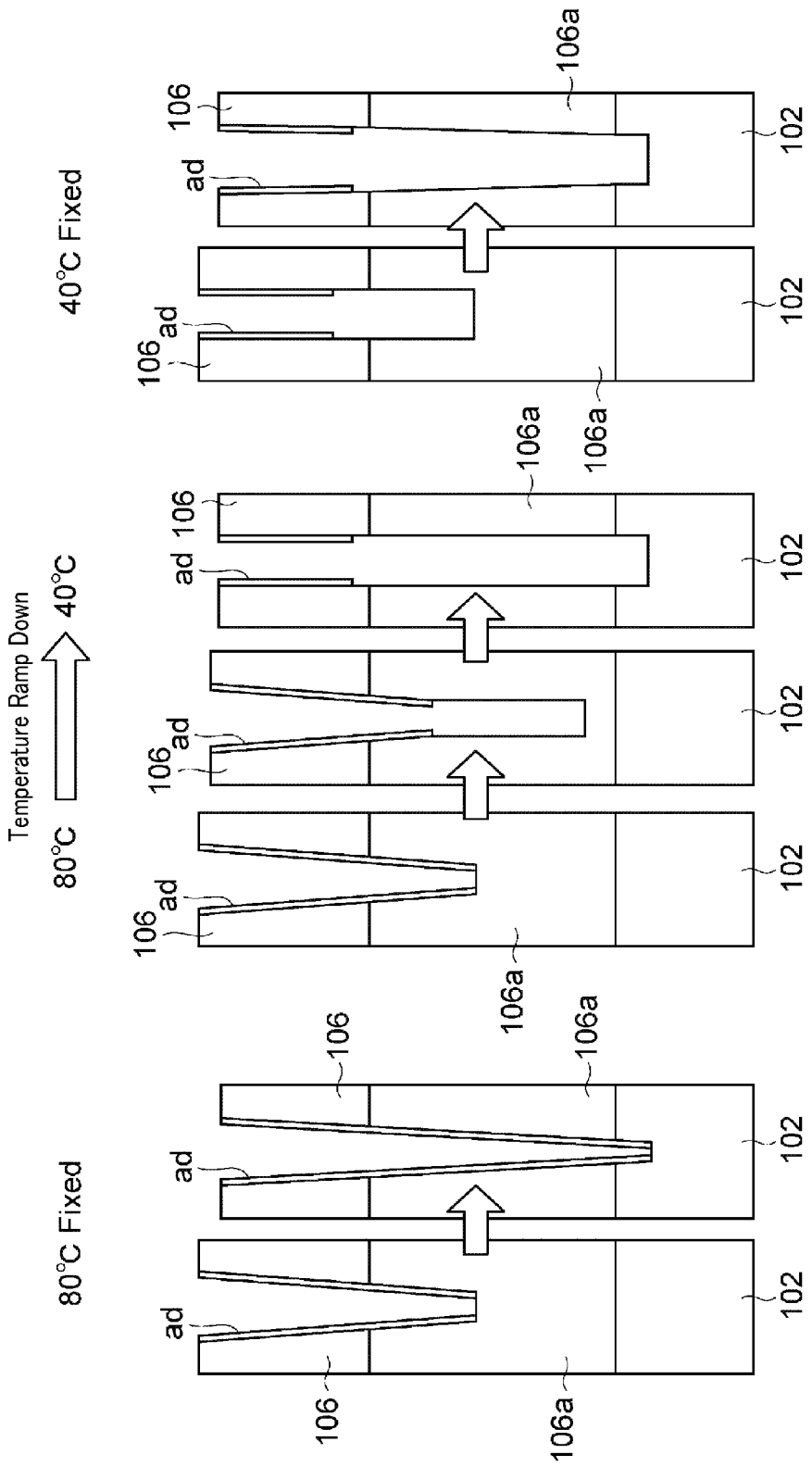

PLASMA ETCHING METHOD

CROSS-REFERENCE TO RELATED APPLICATION

This application claims the benefit of Japanese Patent Application No. 2014-251071 filed on Dec. 11, 2014, the entire disclosures of which are incorporated herein by reference.

TECHNICAL FIELD

The embodiments described herein pertain generally to a plasma etching method.

BACKGROUND

Conventionally, there is known a method of etching a silicon nitride ($SiN_x$ (x is a natural number), SiCN, SiON, etc.) by using plasma.

A conventional plasma etching method is described in, for example, Patent Document 1. In this plasma etching method, a processing target object having a silicon nitride layer and a first mask formed on the silicon nitride layer is prepared, and the processing target object is placed and etched in a plasma processing apparatus. The plasma etching method includes a first process of supplying a processing gas containing oxygen ($O_2$) and fluorocarbon ($CH_xF_y$) (x and y are appropriate integers), and a second process of etching the silicon nitride layer of the processing target object with the first mask by exciting the processing gas into plasma.

Patent Document 1: Japanese Patent No. 3,681,533

When an etching temperature is high, however, a diameter of a hole formed by etching the silicon nitride layer is decreased toward a deep portion thereof, so that the hole finally has a shape in which a tip end portion thereof becomes narrowed (i.e., tapered shaped). Meanwhile, when the etching temperature is low, the diameter of the hole becomes much larger than an opening diameter of the mask which is originally designed. That is, a hole without having the tapered shape and the larger diameter cannot be formed in the silicon nitride, neither when the temperature is high nor when the temperature is low.

SUMMARY

In view of the foregoing, exemplary embodiments provide a plasma etching method capable of forming a hole having a required opening diameter in a silicon nitride layer, while suppressing a tip end portion of the hole from being narrowed.

In one exemplary embodiment, a plasma etching method of etching a processing target object, which includes a silicon nitride layer and a first mask formed on the silicon nitride layer, placed in a plasma processing apparatus includes a first process of supplying a processing gas containing oxygen and fluorocarbon into the plasma processing apparatus; and a second process of etching the silicon nitride layer of the processing target object with the first mask by exciting the processing gas into plasma. Further, the second process is performed in a state where an organic film generated from the processing gas is formed on an inner wall of an opening of the first mask by gradually reducing a temperature of the processing target object from a first temperature T1 to a second temperature T2.

In this case, at near the first temperature T1 as a high temperature, the organic film is formed on the inner wall of the opening of the first mask. Accordingly, it is possible to suppress the diameter of the opening of the first mask from being increased. Further, as the temperature approaches the second temperature T2, the formation of the organic film is suppressed, and the etching in which the tip end portion of the hole becomes narrowed is suppressed. Thus, the hole having a required opening diameter can be formed in the silicon nitride layer, while suppressing the tip end portion of the hole from being narrowed.

Moreover, the processing target object may further include an etching target layer under the silicon nitride layer, and the plasma etching method may further include a third process of etching the etching target layer with the silicon nitride layer, which is etched in the second process, as a second mask.

The hole formed in the second mask has the required opening diameter, and the tip end portion thereof is suppressed from being narrowed, as stated above. Thus, when performing the etching process with this second mask, ions in the plasma can etch the etching target layer based on the shape of the second mask. Therefore, the etching target layer can be etched to have a hole of a required opening diameter, while suppressing the tip end portion of the hole from being narrowed.

Further, the first temperature T1 is set to be 80° C.±10° C. (error range), and the second temperature T2 is set to be 40° C.±10° C. (error range).

In this temperature range, the above-described effects can be appropriately achieved.

For the reason why the temperatures are set to 80° C. and 40° C., if a temperature higher than 80° C. is set, the etching process is performed very slowly, whereas if a temperature lower than 40° C. is set, it may be difficult to suppress the diameter of the hole from being increased.

Furthermore, the reason for allowing the error range is because an appropriate temperature may vary depending on the kind and the thickness of the silicon nitride layer.

In the second process, a time period Time taken to reduce the first temperature T1 to the second temperature T2 satisfies a relationship of $\Delta T = \delta T \times Time$, when a temperature variation per a unit time (sec) is $\delta T$ (° C./sec) and a temperature variation width is $(T2-T1) = \Delta T$ (° C.). Accordingly, there is established a relationship of Time (sec) = (temperature variation $\delta T$)$^{-1}$ (sec/° C.)×temperature variation width $\Delta T$ (° C.). If the $\delta T^{-1}$ (sec/° C.) is set as a slowness coefficient, when the $\delta T^{-1}$ is a negative value, the temperature declines slowly as an absolute value of the $\delta T^{-1}$ increases, whereas the temperature declines rapidly as the absolute value of the $\delta T^{-1}$ decreases. Here, the time period Time satisfies the following relationship.

Time=tapering coefficient $\delta T^{-1}$ (sec/° C.)×temperature variation width $\Delta T$(° C.)≥120 sec.

If the absolute value of the tapering coefficient $\delta T^{-1}$ (sec/° C.) is small, the effect of achieving etching characteristics at each temperature range is diminished, whereas if the absolute value of the temperature variation width $\Delta T$ is small, the effect of using a characteristic difference depending on the temperature is weakened. Thus, it is desirable that the absolute values of the tapering coefficient $\delta T^{-1}$ (sec/° C.) and the temperature variation width $\Delta T$ are large. When the time period Time is equal to or larger than 120 sec, the above-described effects can be appropriately achieved with constant certainty.

According to the exemplary embodiment, the hole having a required opening diameter can be formed in the silicon nitride layer, while suppressing the tip end portion of the hole from being narrowed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 3 is a diagram illustrating etched states of a silicon nitride layer under various conditions;

FIG. 5A to FIG. 5C are diagrams for describing an organic film ad formed on an inner surface of a hole formed in the processing target object under the various conditions specified in FIG. 3.

DETAILED DESCRIPTION

Figure 1:
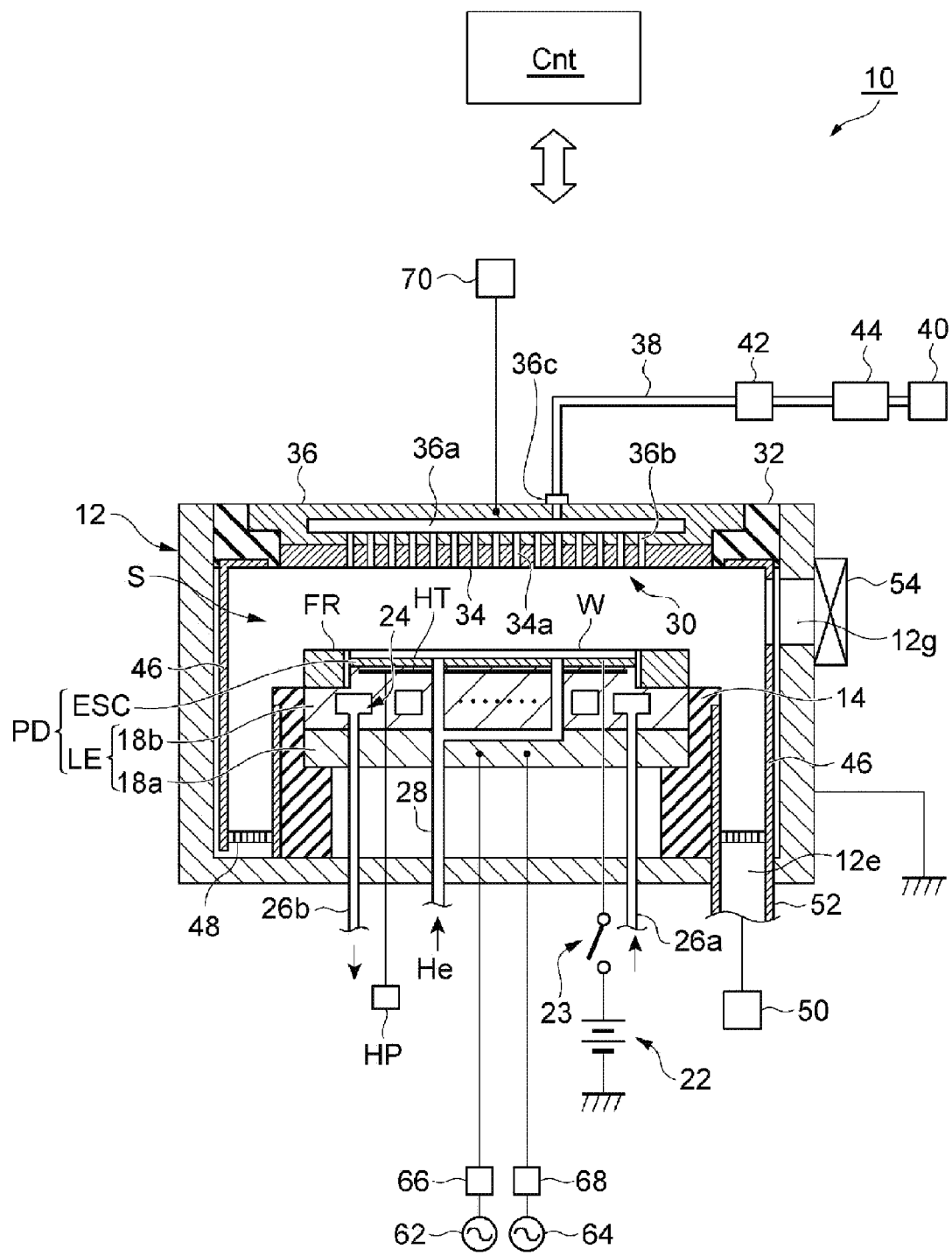
FIG. 1 is a diagram illustrating an outline of a plasma processing apparatus (plasma etching apparatus)

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a diagram illustrating an outline of a plasma processing apparatus configured to perform a plasma etching method according to an exemplary embodiment.

As depicted in FIG. 1, the plasma processing apparatus 10 is configured as a capacitively coupled plasma etching apparatus, and includes a processing vessel 12. The processing vessel 12 has a substantially cylindrical shape. The processing vessel 12 is made of, but not limited to, aluminum, and an inner wall surface thereof is anodically oxidized. This processing vessel 12 is frame-grounded.

A substantially cylindrical supporting member 14 is provided on a bottom portion of the processing vessel 12. The supporting member 14 is made of, by way of non-limiting example, an insulating material. Within the processing vessel 12, the supporting member 14 is vertically extended from the bottom portion of the processing vessel 12. Furthermore, a mounting table PD is provided within the processing vessel 12. The mounting table PD is supported by the supporting member 14.

The mounting table PD is configured to hold a wafer W as a processing target object on a top surface thereof. The mounting table PD has a lower electrode LE and an electrostatic chuck ESC. The lower electrode LE is provided with a first plate 18a and a second plate 18b. The first plate 18a and the second plate 18b are made of a metal such as, but not limited to, aluminum, and each thereof has a substantially disk shape. The second plate 18b is provided on the first plate 18a and electrically connected with the first plate 18a.

The electrostatic chuck ESC is provided on the second plate 18b. The electrostatic chuck ESC includes a pair of insulating films or insulating sheets; and an electrode embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W thereon.

A focus ring FR is provided on a peripheral portion of the second plate 18b to surround an edge of the wafer W and the electrostatic chuck ESC. The focus ring FR is provided to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature controller. A coolant is supplied into the coolant path 24 from a chiller unit provided outside the processing vessel 12 via a pipeline 26a. The coolant supplied into the coolant path 24 is then returned back into the chiller unit via a pipeline 26b. In this way, the coolant is supplied into and circulated through the coolant path 24. A temperature of the wafer W held by the electrostatic chuck ESC is controlled by adjusting a temperature of the coolant.

Furthermore, the plasma processing apparatus 10 is provided with a gas supply line 28. The gas supply line 28 supplies a heat transfer gas, e.g., a He gas, from a heat transfer gas supply device into a gap between a top surface of the electrostatic chuck ESC and a rear surface of the wafer W.

The plasma processing apparatus 10 is also equipped with a heater HT as a heating device. The heater HT is embedded in, for example, the second plate 18b, and is connected to a heater power supply HP. As a power is supplied to the heater HT from the heater power supply HP, the temperature of the mounting table PD is adjusted, and, thus, the temperature of the wafer W placed on the mounting table PD can be adjusted. Alternatively, the heater HT may be embedded in the electrostatic chuck ESC.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other. Provided between the upper electrode 30 and the lower electrode LE is a processing space S in which a plasma process is performed on the wafer W.

The upper electrode 30 is supported at an upper portion of the processing vessel 12 with an insulating shield member 32 therebetween. In the exemplary embodiment, the upper electrode 30 may be configured to have a variable distance in a vertical direction from a top surface of the mounting table PD, i.e., a wafer mounting surface. The upper electrode 30 may include an electrode plate 34 and an electrode supporting body 36. The electrode plate 34 faces the processing space S and is provided with a multiple number of gas discharge holes 34a. In the exemplary embodiment, the electrode plate 34 is made of silicon.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. A multiple number of gas through holes 36b is extended downwards from the gas diffusion space 36a, and these gas through holes 36b respectively communicate with the gas discharge holes 34a. Further, the electrode supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources. The gases sources may include one or more sources of a fluorocarbon gas, a source of an oxygen gas ($O_2$ gas), and a source of a rare gas. The fluorocarbon gas may be a gas including at least one of $C_4F_6$, $C_4F_8$, and $C_6F_6$. In one exemplary embodiment, the gas sources may include a source of the $C_4F_6$ gas and a source of the $C_4F_8$ gas. Further, the source of the rare gas may be a source of the rare gas such as an Ar gas or a He gas.

The valve group 42 includes a multiplicity of valves, and the flow rate controller group 44 includes multiple flow rate controllers such as mass flow controller. Each of the gas sources belonging to the gas source group 40 is connected to the gas supply line 38 via each corresponding valve belonging to the valve group 42 and each corresponding flow rate controller belonging to the flow rate controller group 44.

Furthermore, in the plasma processing apparatus 10, a deposition shield 46 is detachably provided along an inner wall of the processing vessel 12. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$.

A gas exhaust plate 48 is provided at a bottom portion of the processing vessel 12 and provided between the supporting member 14 and the inner wall of the processing vessel 12. The gas exhaust plate 48 may be made of, by way of example, an aluminum member coated with ceramic such as $Y_2O_3$. The processing vessel 12 is also provided with a gas exhaust opening 12e under the gas exhaust plate 48, and the gas exhaust opening 12e is connected with a gas exhaust device 50 via a gas exhaust line 52. The gas exhaust device 50 includes a vacuum pump such as a turbo molecular pump and is capable of depressurizing the inside of the processing vessel 12 to a desired vacuum level. Further, a carry-in/out opening 12g for the wafer W is formed through a sidewall of the processing vessel 12, and this carry-in/out opening 12g is opened or closed by a gate valve 54.

The plasma processing apparatus 10 further includes a first high frequency power supply 62 and a second high frequency power supply 64. The first high frequency power supply 62 is configured to generate a first high frequency power for plasma generation. That is, the first high frequency power supply 62 generates a high frequency power having a frequency in a range from 27 MHz to 100 MHz, e.g., 40 MHz. The first high frequency power supply 62 is connected to the lower electrode LE via a matching device 66. The matching device 66 is a circuit for matching an output impedance of the first high frequency power supply 62 and an input impedance on a load side (lower electrode LE).

The second high frequency power supply 64 is configured to generate a second high frequency power for ion attraction into the wafer W, i.e., a high frequency bias power having a frequency in a range from 400 kHz to 13.56 MHz, e.g., 3.2 MHz. The second high frequency power supply 64 is connected to the lower electrode LE via a matching device 68. The matching device 68 is a circuit for matching an output impedance of the second high frequency power supply 64 and the input impedance on the load side (lower electrode LE).

The plasma processing apparatus 10 further includes a power supply 70. The power supply 70 is connected to the upper electrode 30. The power supply 70 is configured to apply, to the upper electrode 30, a voltage for attracting positive ions existing within the processing space S to the electrode plate 34. In the exemplary embodiment, the power supply 70 is a DC power supply configured to generate a negative DC voltage. As another example, the power supply 70 may be an AC power supply configured to generate an AC voltage having a relatively low frequency. The voltage applied from the power supply 70 to the upper electrode 30 may be equal to or less than −150 V. That is, the voltage applied to the upper electrode 30 from the power supply 70 may be a negative voltage having an absolute value of 150 V or larger. If such a voltage is applied from the power supply 70 to the upper electrode 30, the positive ions existing within the processing space S collide with the electrode plate 34. As a result, secondary electrons and/or silicon are emitted from the electrode plate 34.

Furthermore, according to the exemplary embodiment, the plasma processing apparatus 10 further includes a controller Cnt. The controller Cnt is a computer including a processor, a memory unit, an input device, a display device, and so forth, and is configured to control individual components of the plasma processing apparatus 10. To be specific, the controller Cnt is connected to the valve group 42, the flow rate controller group 44, the gas exhaust device 50, the first high frequency power supply 62, the matching device 66, the second high frequency power supply 64, the matching device 68, the power supply 70, the heater power supply HP and the chiller unit.

The controller Cnt is operated according to a program based on inputted recipes, and sends control signals. In response to the control signals from the controller Cnt, selection of a gas supplied from the gas source group and a flow rate of the selected gas, a gas exhaust by the gas exhaust device 50, power supplies from the first and second high frequency power supplies 62 and 64, a voltage application from the power supply 70, a power supply from the heater power supply HP, a flow rate and a temperature of a coolant from the chiller unit can be controlled.

Etching is performed as follows, by using the above-described plasma processing apparatus.

Figure 4A:
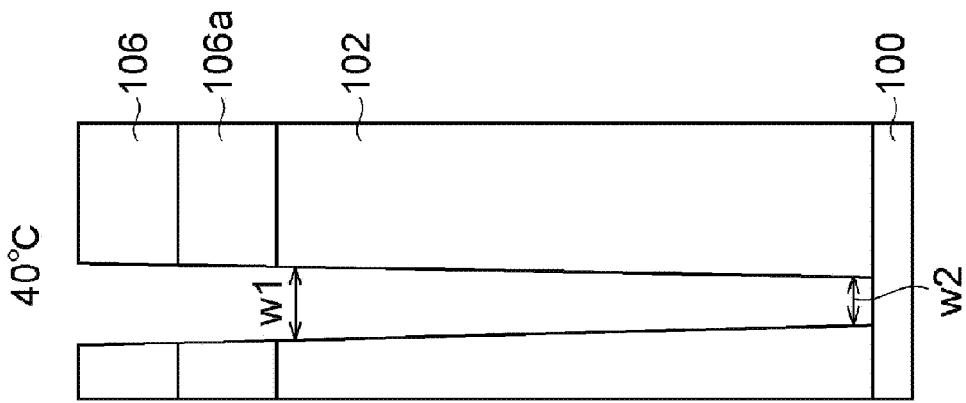
FIG. 4A and FIG. 4B are diagrams illustrating a longitudinal profile of the processing target object in respective cases of etching an etching target layer, which is provided under the silicon nitride layer, by using the silicon nitride layer as a second mask (FIG. 4A depicts an exemplary embodiment and FIG. 4B, a comparative example)
Figure 4B:
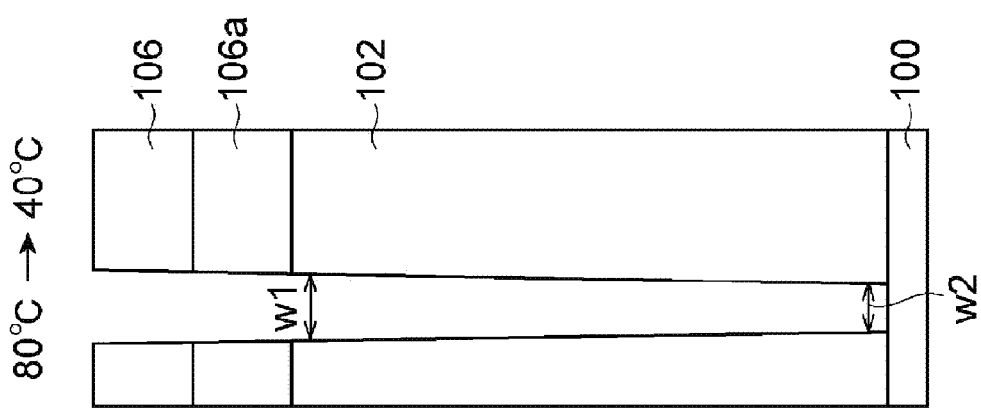

First, the processing target object is prepared. As depicted in FIG. 4A and FIG. 4B, the processing target object is a wafer having, on a support substrate 100, an etching target layer 102, a silicon nitride layer 106a and a first mask 106. SiO$_2$ is used as the etching target layer 102, and a photoresist made of a resin is used as the first mask 106. Since, however, the present disclosure aims at improving etching accuracy of the silicon nitride layer, other materials can be appropriately used for the etching target layer and the first mask. The silicon nitride layer 106a may be, for example, SiN$_x$ (x is a natural number), SiCN, SiON, or the like.

Subsequently, in a first process, a processing gas containing oxygen and fluorocarbon is supplied into the plasma processing apparatus.

Thereafter, in a second process, the processing gas is excited into plasma, and the silicon nitride layer 106a of the processing target object is etched with the first mask 106.

To excite the processing gas into the plasma, high frequency powers are supplied from the first and second high frequency power supplies 62 and 64. Here, the second process is performed in the state where an organic film ad (see FIG. 5A to FIG. 5C) generated from the processing gas is formed on an inner wall of an opening of the first mask by gradually reducing the temperature of the processing target object from a first temperature T1 to a second temperature T2.

Figure 2:
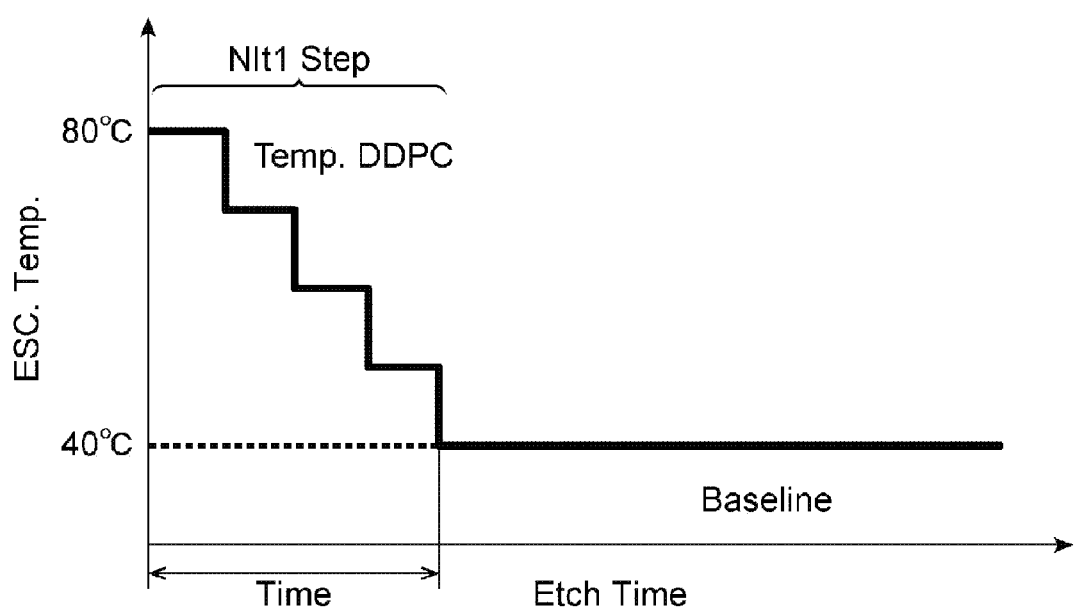
FIG. 2 is a timing chart showing a relationship between an etching time (Etch Time) and a temperature of a processing target object (ESC. Temp.)

FIG. 2 is a timing chart showing a relationship between an etching time (Etch Time) and a temperature of the processing target object (ESC. Temp.).

The temperature of the processing target object is reduced into multiple stages until it reaches the second temperature T2 (40° C.) from the first temperature T1 (80° C.) at which the plasma is generated. Then, the temperature of the processing target object is maintained constant at the second temperature T2 which serves as a baseline.

Here, the time period Time taken to reduce the first temperature T1 to the second temperature T2 in the second process is calculated as follows. When a temperature variation per a unit time (sec) is δT (° C./sec) and a temperature variation width is (T2−T1)=ΔT (° C.), there is a relationship of ΔT=δT×Time. Accordingly, there is established a relationship of Time (sec)=(temperature variation δT)$^{-1}$ (sec/° C.)×temperature variation width ΔT (° C.). If the δT$^{-1}$ (sec/° C.) is set as a tapering coefficient, when the δT$^{-1}$ is a negative value, the temperature declines slowly as the absolute value of the δT$^{-1}$ increases, whereas the temperature declines rapidly as the absolute value of the δT$^{-1}$ decreases. Here, the time period Time satisfies the following relationship.

Time=tapering coefficient δT$^{-1}$ (sec/° C.)×temperature variation width ΔT(° C.)≥120 sec If the absolute value of the tapering coefficient δT$^{-1}$ (sec/° C.) is small, the effect of achieving etching characteristics at each temperature range is diminished, whereas if the absolute value of the temperature variation width ΔT is small, the effect of using a characteristic difference depending on the temperature is weakened. Thus, it is desirable that the absolute values of the tapering coefficient δT$^{-1}$ (sec/° C.) and the temperature variation width ΔT are large. When the Time is equal to or larger than 120 sec, the above-described effects can be appropriately achieved with constant certainty.

Further, it is desirable that the absolute values of the tapering coefficient δT$^{-1}$ (sec/° C.) and the temperature variation width ΔT (° C.) fall within the following ranges for the aforementioned reasons.

3 (sec/° C.)≤|Tapering coefficient δT$^{-1}$|(sec/° C.)≤15 (sec/° C.)

20 (° C.)≤|Temperature variation width ΔT|(° C.)≤40(° C.)

Here, the "Time" is a time period during which the silicon nitride layer is etched and is composed of NIt1 Step where the temperature declines in stages. This method is called DDPC (Depth Dependent Process Control).

In this case, near the first temperature T1 as a high temperature, an organic film ad is formed on the inner wall of the opening of the first mask 106 (see the left diagram of FIG. 5B). Accordingly, it is possible to suppress the diameter of the opening of the first mask 106 from being increased.

Further, as the temperature approaches the second temperature T2, the formation of the organic film ad is suppressed, and the etching in which the tip end portion of the hole becomes narrowed is suppressed (see the right diagram of FIG. 5B). Thus, a hole having a required opening diameter can be formed in the silicon nitride layer, while suppressing the tip end portion of the hole from being narrowed.

Moreover, as depicted in FIG. 4A and FIG. 4B, the processing target object is provided with the etching target layer 102 under the silicon nitride layer 106a, and a third process of etching the etching target layer 102 with the silicon nitride layer 106a, which has been etched in the second process, as a second mask is further performed.

The hole formed in the second mask has the required opening diameter, and the tip end portion thereof is suppressed from being narrowed, as stated above. In the etching using this second mask, ions in the plasma etch the etching target layer 102 according to the shape of the second mask. Therefore, the hole having a required opening diameter can also be formed in the etching target layer 102, while suppressing the tip end portion of the hole from being narrowed (see FIG. 4A).

Meanwhile, if the temperature at which the processing target object is etched is fixed at 40° C., the opening diameter of the hole is increased (FIG. 4B).

In FIG. 4A and FIG. 4B, a diameter (width) w2 of a bottom portion of the hole is 21.4 nm. In FIG. 4A according to the present exemplary embodiment, a diameter (width) w1 of an opening end of the etching target layer 102 is 28.3 nm, whereas in FIG. 4B according to the comparative example, the diameter (width) w1 of the opening end of the etching target layer 102 is 32.0 nm.

FIG. 3 is a diagram showing etched states of the silicon nitride layer under various conditions, and FIG. 5A to FIG. 5C are diagrams for describing the organic film ad adhering to the inner surface of the hole formed in the processing target object under the respective conditions depicted in FIG. 3. Further, in FIG. 3, a thick arrow indicates a lapse of time as it goes toward the tip end portion of the hole, and the temperature becomes lower as the degree of darkness of the arrows is increased.

As stated above, according to the present exemplary embodiment, the DDPC method in which the etching temperature is reduced in stages is employed (see the middle diagram of FIG. 3, and FIG. 5B). In this case, the organic film ad on the inner surface of the hole functions effectively and suppresses the tip end portion of the hole from being narrowed in a depth direction (i.e., tapering state) while suppressing the diameter CD of the hole from being increased (i.e., achieving a shrink state). Therefore, a vertically extended hole can be formed.

If the etching is performed at the fixed temperature (80° C.) (the left diagram of FIG. 3, and FIG. 5A), the organic film ad is continuously deposited, so that the ions are bent, and the hole has the shape in which the tip end portion thereof is narrowed.

Meanwhile, if the etching is performed at the fixed temperature (40° C.) (the right diagram of FIG. 3, and FIG. 5C), the organic film ad is hardly deposited, so that the diameter of the hole is increased.

On the other hand, according to the etching of the exemplary embodiment (the middle diagram of FIG. 3, and FIG. 5B), the organic film ad is deposited at near the first temperature T1 but hardly deposited at near the second temperature T2. Accordingly, it is possible to form a vertical hole having a required diameter, as stated above.

In this case, the first temperature T1 is 80° C.±10° C. (error range), and the second temperature is 40° C.±10° C. (error range).

When the etching temperature is in this range, the above-described effects can be appropriately achieved.

For the reason why the temperature is set to 80° C. and 40° C., if a temperature higher than 80° C. is set, the etching is performed very slowly, whereas if the temperature lower than 40° C. is set, it may be difficult to suppress the diameter of the hole from being increased.

Furthermore, the reason for setting the error range is because an appropriate temperature may vary depending on the kind and the thickness of the silicon nitride layer.

Further, the processing gas may include a $C_4F_6$ gas, a $C_4F_8$ gas, a $CH_3F$ gas, a $CH_2F_2$ gas, a $CHF_3$ gas, an $O_2$ gas and an Ar gas. In the above-described exemplary embodiment, however, a $C_4F_8$ gas, a $CH_2F_2$ gas and an $O_2$ gas are used. Further, a high frequency power having a frequency of 40 MHz and a high frequency power having a frequency of 3.2 MHz are supplied form the first and second high frequency power supplies 62 and 64, respectively. Further, in the exemplary embodiment and the comparative example, thicknesses of the respective layers are as follows, and the etching time is 150 seconds.

First mask: 700 nm (Polysilicon: poly-Si)
Silicon nitride layer: 200 nm
Etching target layer: Silicon oxide film From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. By way of example, the first high frequency power supply 62 may be connected to the upper electrode 30 via the matching device 66.

Further, capacitively coupled plasma (CCP) is by accelerating electrons and ions with an electric potential on an electrode, and has a wide applications such as a parallel plate type reactive ion etching (RIE) apparatus or a sputtering apparatus. Moreover, inductively coupled plasma (ICP) is generated by electromagnetic induction while introducing a high frequency power into plasma through a dielectric. Further, electron cyclotron resonance (ECR) plasma is generated by introducing a microwave under the presence of a magnetic field and accelerating electrons through the ECR. In the above-described exemplary embodiment, the CCP is used. However, the present disclosure is also applicable to the etching with the aforementioned other types of plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma etching method of etching a processing target object, which includes a silicon nitride layer and a first mask formed on the silicon nitride layer, placed in a plasma processing apparatus, the plasma etching method comprising:
   a first process of supplying a processing gas containing oxygen and fluorocarbon into the plasma processing apparatus; and
   a second process of etching the silicon nitride layer of the processing target object with the first mask by exciting the processing gas into plasma to form a substantially vertically extended hole from an upper end portion of the hole to a bottom end portion of the hole,
   wherein the second process is performed in a state where an organic film generated from the processing gas is formed on an inner wall of an opening of the first mask by reducing a temperature of the processing target object from a first temperature of about 80° C. to a second temperature of about 40° C.,
   the temperature of the processing target object is reduced into multiple stages until the temperature reaches the second temperature from the first temperature to form the substantially vertically extended hole, and
   wherein a tapered hole is formed at the first temperature, and the tapered hole is changed into the substantially vertically extended hole by reducing the temperature from the first temperature to the second temperature.

2. The plasma etching method of claim 1,
   wherein the processing target object further includes an etching target layer under the silicon nitride layer, and
   the plasma etching method further comprises:
   a third process of etching the etching target layer with the silicon nitride layer, which is etched in the second process, as a second mask.

3. The plasma etching method of claim 1,
   wherein when a temperature variation per a unit time (sec) is δT (° C./sec) and a temperature variation width (the second temperature−the first temperature) is ΔT (° C.), $$3 \text{ (sec/° C.)} \leq |\text{Tapering coefficient } \delta T^{-1}| \text{(sec/° C.)} \leq 15 \text{ (sec/° C.), and}$$

$$20 \text{ (° C.)} \leq |\text{Temperature variation width } \Delta T|\text{(° C.)} \leq 40 \text{(° C.),}$$

when a time period taken to reduce the first temperature to the second temperature in the second process is a Time, the Time satisfies a following relationship:

$$\text{Time} = \text{Tapering coefficient } \delta T^{-1} \text{ (sec/° C.)} \times \text{Temperature variation width } \Delta T \text{ (° C.)} \geq 120 \text{ sec, and}$$

wherein the first temperature is set to be 80° C.±10° C., and
   the second temperature is set to be 40° C.±10° C.

* * * * *